United States Patent
Saether

(10) Patent No.: US 7,336,542 B2
(45) Date of Patent: Feb. 26, 2008

(54) NONVOLATILE LATCH

(75) Inventor: Terje Saether, Trondheim (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/049,334

(22) Filed: Feb. 1, 2005

(65) Prior Publication Data

US 2006/0171201 A1    Aug. 3, 2006

(51) Int. Cl.
*G11C 7/10*    (2006.01)
(52) U.S. Cl. ............... 365/189.05; 365/185.08; 365/154; 365/185.04
(58) Field of Classification Search .......... 365/185.07, 365/185.08, 189.05, 154, 185.04
See application file for complete search history.

(56) References Cited

U.S. PATENT DOCUMENTS

| 4,975,878 | A | 12/1990 | Boddu et al. |
| 5,287,317 | A * | 2/1994 | Kobayashi et al. ......... 365/218 |
| 5,781,471 | A | 7/1998 | Kowshik et al. |
| 6,222,765 | B1 | 4/2001 | Nojima |
| 6,307,773 | B1 | 10/2001 | Smith |
| 6,363,011 | B1 * | 3/2002 | Hirose et al. .......... 365/185.07 |
| 6,411,545 | B1 | 6/2002 | Caywood |
| 6,529,407 | B2 | 3/2003 | Shukuri |
| 2004/0008539 | A1 | 1/2004 | Pascucci |

* cited by examiner

*Primary Examiner*—Huan Hoang
(74) *Attorney, Agent, or Firm*—Sawyer Law Group LLP

(57) ABSTRACT

A nonvolatile latch includes a memory element for storing an input data value. A write protect element is coupled to the memory element for utilizing a write protect signal to ensure the input data value stored by the memory element remains during a loss of a supply voltage to the latch.

14 Claims, 3 Drawing Sheets

NONVOLATILE LATCH

FIELD OF THE INVENTION

The present invention relates to a nonvolatile latch.

BACKGROUND OF THE INVENTION

Circuits with flip-flops are used in the digital signal processing field for storing logic states. Flip-flops are common examples of a circuit employing sequential logic, also called bistable gates, i.e., having two stable states. The flip-flop maintains its states indefinitely until an input pulse called a trigger is received. If a trigger is received, the flip-flop outputs change their states according to defined rules, and remain in those states until another trigger is received. Thus, they consist internally of a control element, which takes the logic state which is applied to its input and makes it available for evaluation at its output, and of a holding element, which maintains the state which is set. Flip-flop circuits are interconnected to form the logic gates that comprise digital integrated circuits (ICs), such as memory chips and microprocessors.

A flip-flop includes two latches, and each latch contains a memory element. FIG. 1 illustrates a circuit diagram of a prior art latch 100. The circuit 101 shows an inverter comprising transistors 103, 105 (PMOS/NMOS P14/N12) to illustrate the generation of the inverted clock signal (CPN) for latch 100 use. In operation, when the clock signal (CP) is in a low state, data that is on the data input (D) passes through the switch 110 (formed by transistors 112, 114 N0/P0), sets the storage node (S), passes through the inverter 120 (formed by transistors 122, 124 P10/N8) and the inverter 130 (formed by transistors 132, 134 P15/N13), resulting in the data output (Q) having the same value as the input D. Thus, the latch 100 is transparent, and data passes through. When the clock signal CP goes to a high state, the input switch 110 will no longer pass the data, and the data is stored through a memory element 140 comprising the inverter 120, the inverter 150 (formed by transistors 152, 154 P12/N10), and the switch 160 (formed by the transistors 162, 164 N11/P13). In this manner, the latch is 'latched,' and the data stored on the storage node will be present on the output regardless of how data changes on the input. If the supply voltage VDD is turned off, the inverters 120, 150 in the core will lose their power, and data is lost. Such volatility can be undesirable.

Accordingly, a need exists for a nonvolatile latch. The present invention addresses such a need.

BRIEF SUMMARY OF THE INVENTION

A nonvolatile latch includes a memory element for storing an input data value. A write protect element is coupled to the memory element for utilizing a write protect signal to ensure the input data value stored by the memory element remains during a loss of a supply voltage to the latch.

Through the present invention, the ability to provide nonvolatile operation in a latch is achieved in a straightforward and efficient manner. These and other advantages of the aspects of the present invention will be more fully understood in conjunction with the following detailed description and accompanying drawings.

DETAILED DESCRIPTION OF THE INVENTION

The present invention relates to a nonvolatile latch. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Figure 1:
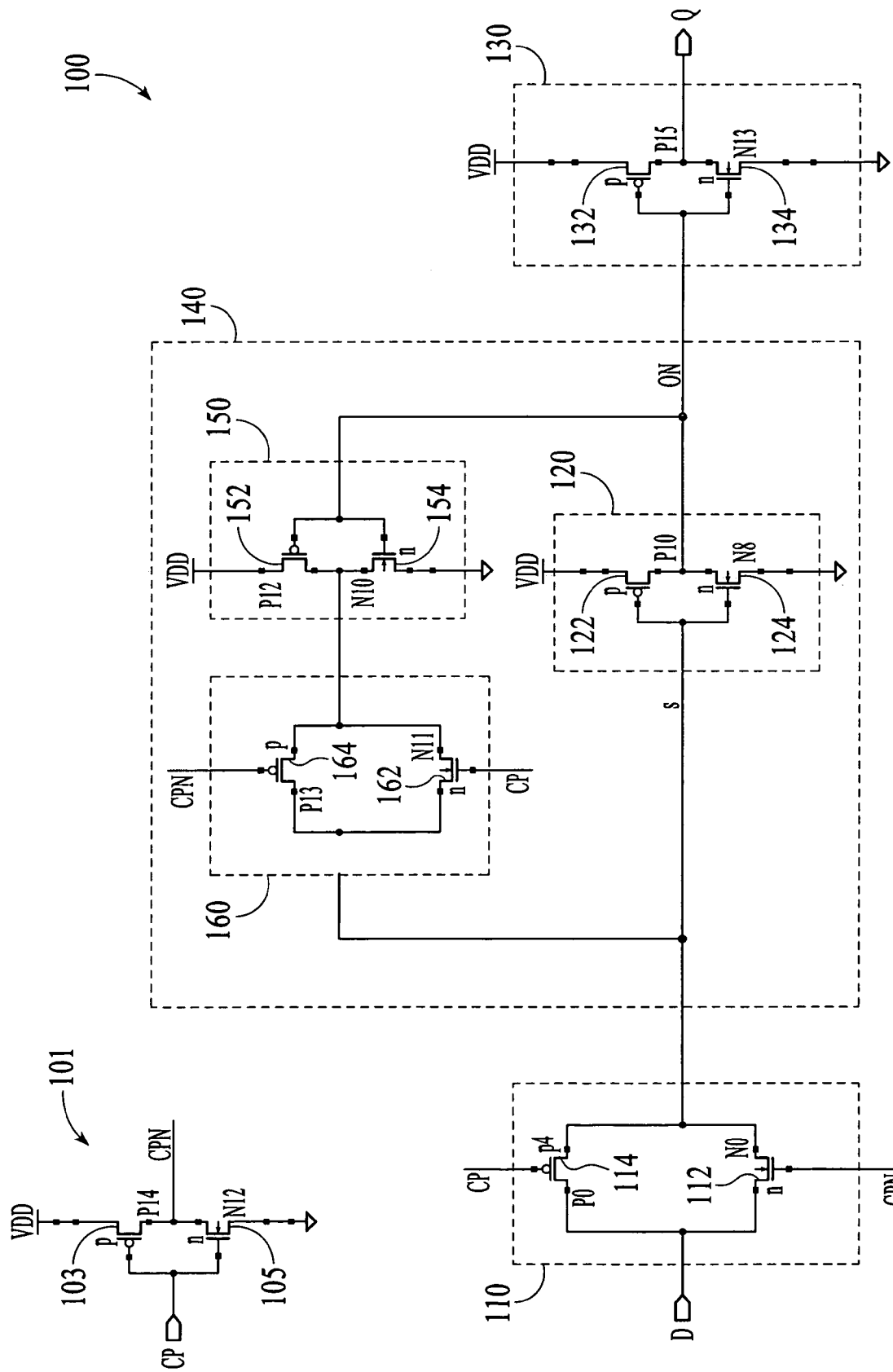
FIG. 1 illustrates a circuit diagram of a prior art, volatile latch.
Figure 2:
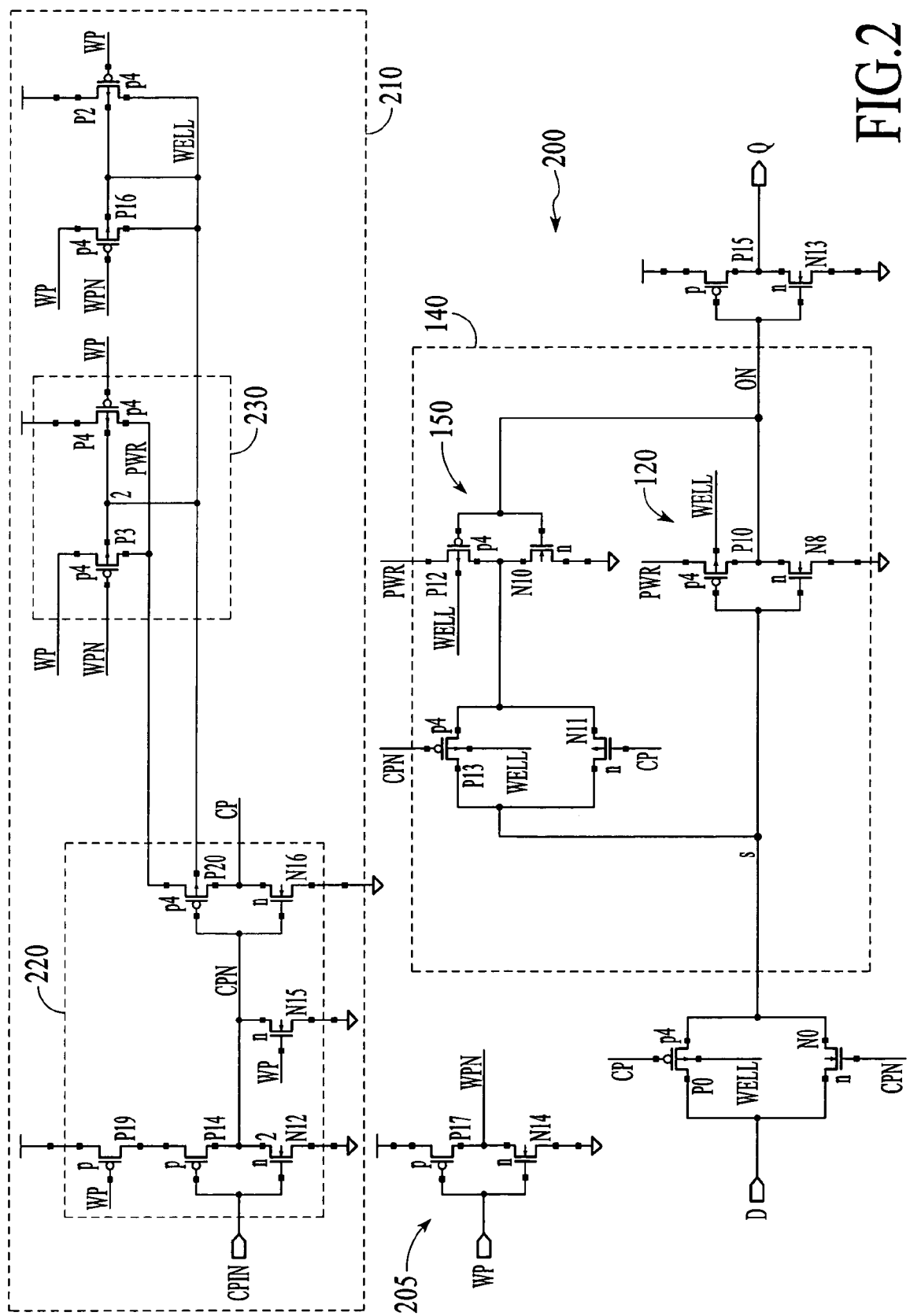
FIG. 2 illustrates a circuit diagram of a nonvolatile latch in accordance with the present invention.

FIG. 2 illustrates a nonvolatile latch 200 in accordance with the present invention. In the following discussion, the nonvolatile latch is described as an add-on to the prior art latch presented hereinabove with reference to FIG. 1 in order to highlight the differences between the two. Thus, like components are labeled similarly in FIGS. 1 and 2. However, it should be appreciated that the presentation of the nonvolatile latch as an add-on is meant as illustrative of the aspects of the present invention, and a latch or flip-flop can be designed solely as nonvolatile in accordance with the description provided hereinbelow, which may provide greater efficiency, as is well understood by those skilled in the art.

Referring now to FIG. 2, in operation, a write protect (WP) signal is used by a write protect circuit 210 to ensure nonvolatile performance by the latch 200. (Generation of an inverted write protect signal (WPN) occurs via an inverter circuit 205.) When the power is on, WP is in a low state, and the nonvolatile latch 200 behaves as described for latch 100. When power is lost, WP changes to a high state, and the data in the latch 200 is maintained via the write protect circuit 210, which, in a preferred embodiment, includes a clock disable circuit 220 coupled to a power source circuit 230. The changing of WP to a high state is controlled by a power management unit (not shown). For example, as is well understood in the art, a power management unit manages the turning off of power to a processor core while preventing leakage currents when a power-off mode is entered to save power. The clock stops, and WP enters a high state. Alternatively, power is lost, such as by battery decay, by the user replacing the batteries, or by the main power being gone. External capacitors always maintain some charge in order to prevent the power supply from dropping too fast. The power management unit senses the drop through a brown-out detector or reset circuit and immediately stops the clock, forces WP high, and turns off the processor core to conserve as much power as possible.

Figure 3:
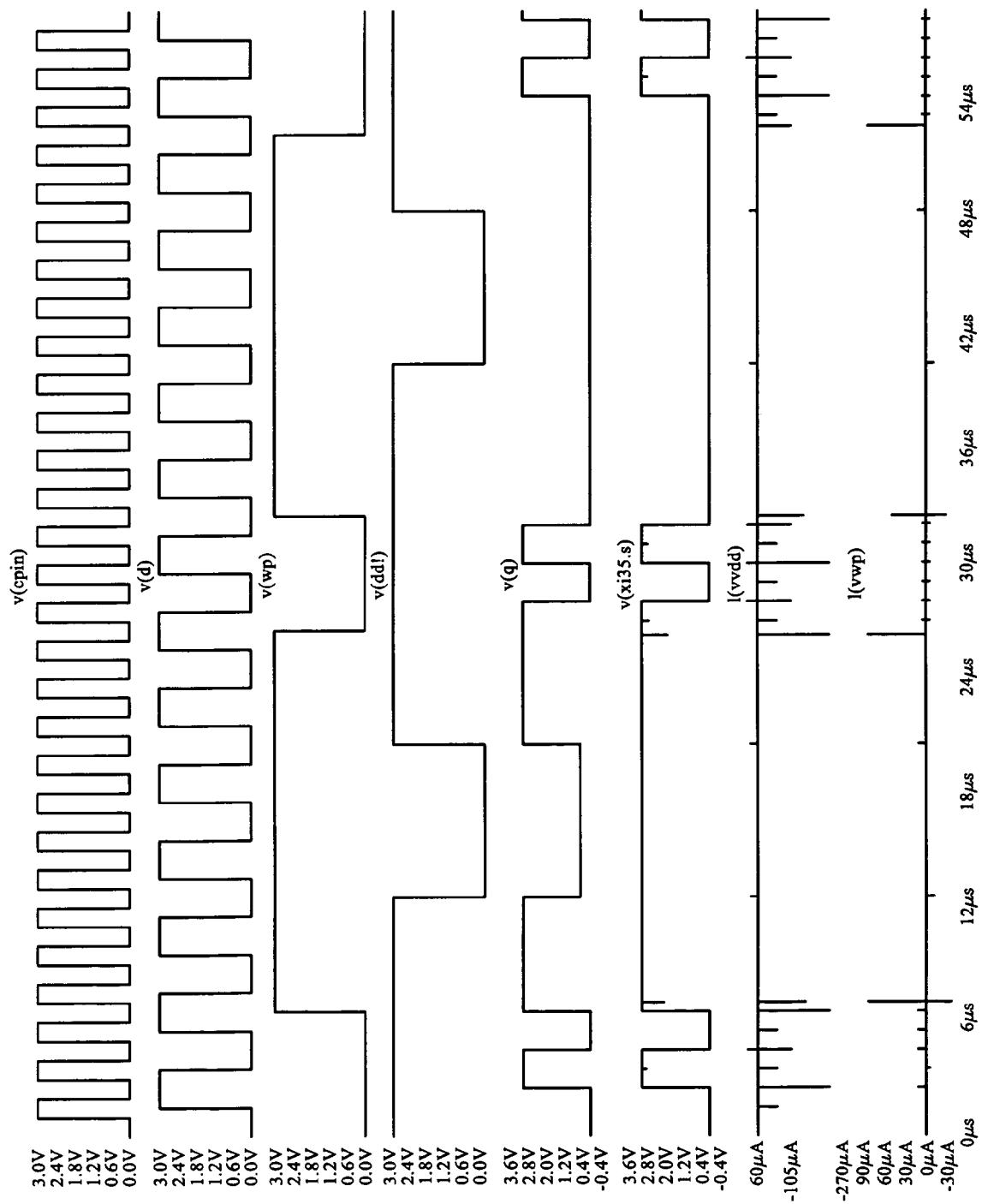
FIG. 3 illustrates a simulation signal diagram of an example of operation for the circuit of FIG. 2.

A simulation of circuit operation during changes to signal states of the WP signal is presented with reference to an example signal diagram in FIG. 3, which demonstrates the ability of the write protect circuit 210 to ensure that data stored by the latch 200 is maintained during a loss of power supply VDD. The first 6.5 us (microseconds) shows normal operation. At 6.5 us, WP changes to a high state, which disables the clock internally in the latch 200 via the clock disable circuit 210, and the latch 200 will no longer accept any new data. At the same time, the memory element 140 will disconnect from the main power supply VDD. WP becomes the power source (PWR) used by inverters 120, 150 via the power source circuit 230 (transistors P3 and P4). As there is no longer any activity in the latch 200, there is no active power drawn from WP, although there is leakage current I(VWP). Accordingly, WP can be treated as a normal signal and not as a power bus. The supply voltage VDD (v(vdd!)) is turned off at 12.5 us, but, as shown by the preservation of the voltage on the memory node, v(xi35.s), this does not affect the memory element 140. The output Q, shown by the signal v(q), transitions to a low state and floats when the supply voltage is gone. Normally, the clock (v(cp)) and data inputs (v(d)) will go low or be floating when the supply voltage is turned off but for simplicity they are still running, i.e., knowledge about the data input or clock states when the supply voltage is off can be used to simplify the latch. At 20.5 us, the supply voltage is applied again, but the latch 200 still will not accept any new data. The output Q goes high again since this was the stored data until the supply voltage was gone. At 26.5 us, WP goes low and the latch 200 resumes normal operation. At 32.5 us, the latch 200 is again write protected but now a zero is stored in the latch.

Thus, the write protect circuit of the present invention successfully allows a latch to maintain its data even when a supply voltage is lost. Such a nonvolatile latch can be used as one latch in a flip-flop, for example, to achieve a non-volatile flip-flop. In this manner, higher data integrity from components with more versatility for better performance results.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

I claim:

1. A nonvolatile latch comprising:
   a memory element for storing an input data value; and
   a write protect element coupled to the memory element, the write protect element comprising a power source circuit coupled to a clock disable circuit and utilizing a write protect signal to ensure the input data value stored by the memory element remains during a loss of a supply voltage to the nonvolatile latch.

2. The nonvolatile latch of claim 1 wherein the power source circuit provides a power source signal to the memory element when the write protect signal is in a first state.

3. The nonvolatile latch of claim 2 wherein the clock disable circuit disables a clock signal internally when the write protect signal is in the first state.

4. The nonvolatile latch of claim 3 wherein conventional latch operation occurs when the write protect signal is in a second state.

5. The nonvolatile latch of claim 4 wherein the write protect signal is in the second state when the supply voltage is regained.

6. A method for achieving nonvolatile data storage in a latch, the method comprising:
   storing an input data value in a latch memory element; and
   utilizing a write protect signal in a latch write protect element to ensure the input data value stored by the memory element remains during a loss of a supply voltage to the latch, wherein the latch write protect circuit comprises a power source circuit coupled to a clock disable circuit.

7. The method of claim 6 further comprising providing a power source signal from the power source circuit to the latch memory element when the write protect signal is in a first state.

8. The method of claim 7 further comprising disabling a clock signal internally through the clock disable circuit when the write protect signal is in the first state.

9. The method of claim 8 further comprising resuming conventional latch operation with the write protect signal in a second state when the supply voltage is regained.

10. A latch capable of nonvolatile operation, the latch comprising:
    an input element for receiving an input data value;
    a memory element coupled to the input element for storing the input data value;
    a write protect element coupled to the memory element, the write protect element comprising a power source circuit coupled to a clock disable circuit and utilizing a write protect signal to ensure the input data value stored by the memory element remains during a loss of a supply voltage to the latch; and
    an output element coupled to the memory element for outputting a stored data value.

11. The latch of claim 10 wherein the power source circuit provides a power source signal to the memory element when the write protect signal is in a first state.

12. The latch of claim 11 wherein the clock disable circuit disables a clock signal internally when the write protect signal is in the first state.

13. The latch of claim 12 wherein conventional latch operation occurs when the write protect signal is in a second state.

14. The latch of claim 13 wherein the write protect signal transitions to the second state when the supply voltage is regained.

* * * * *